(12) United States Patent
Wuerstlein et al.

(10) Patent No.: US 8,228,077 B2
(45) Date of Patent: Jul. 24, 2012

(54) ANTI-PINCH SENSOR

(75) Inventors: Holger Wuerstlein, Zeil am Main (DE); Thomas Weingaertner, Memmelsdorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 809 days.

(21) Appl. No.: 12/325,133

(22) Filed: Nov. 28, 2008

(65) Prior Publication Data

US 2009/0146827 A1 Jun. 11, 2009

(30) Foreign Application Priority Data

Nov. 30, 2007 (DE) .......................... 20 2007 016 734

(51) Int. Cl.
*G01R 27/26* (2006.01)
(52) U.S. Cl. ........ 324/686; 324/661; 324/663; 324/688; 340/545.1; 340/562
(58) Field of Classification Search .................. 324/658, 324/661, 663, 686, 688; 340/545.04, 561, 340/562
See application file for complete search history.

(56) References Cited

U.S. PATENT DOCUMENTS

| | | | | |
|---|---|---|---|---|
| 5,373,245 A * | 12/1994 | Vranish | ......................... | 324/662 |
| 6,310,611 B1 * | 10/2001 | Caldwell | ....................... | 345/173 |
| 6,724,324 B1 * | 4/2004 | Lambert | ....................... | 324/663 |
| 6,972,575 B2 * | 12/2005 | Lambert et al. | ................ | 324/663 |
| 7,116,117 B2 * | 10/2006 | Nakano et al. | ................ | 324/688 |
| 7,202,674 B2 * | 4/2007 | Nakano et al. | ................ | 324/661 |
| 7,545,153 B2 * | 6/2009 | Abe | .............................. | 324/663 |
| 2006/0117862 A1 * | 6/2006 | Shank et al. | .................... | 73/780 |

* cited by examiner

*Primary Examiner* — Timothy J Dole
(74) *Attorney, Agent, or Firm* — Muncy, Geissler, Olds & Lowe, PLLC

(57) ABSTRACT

An Anti-pinch sensor, in particular for detecting an obstacle in the path of an actuator of a motor vehicle is provided. The anti-pinch sensor includes a first measurement electrode and a second electrically isolated measurement electrode spaced a distance from the first measurement electrode, wherein the first measurement electrode is designed to generate an external electric field with respect to the second measurement electrode, and wherein the first and second measurement electrodes are elastically supported relative to an electrically isolated ground electrode. In addition, a sensor device having such an anti-pinch sensor is disclosed. The anti-pinch sensor is suitable as both a contactless and a tactile sensor. Detection of surface deposits of contaminants or water is easily possible.

19 Claims, 3 Drawing Sheets

ANTI-PINCH SENSOR

This nonprovisional application claims priority under 35 U.S.C. §119(a) to German Patent Application No. 20 2007 016 734.2, which was filed in Germany on Nov. 30, 2007, and which is herein incorporated by reference.

BACKGROUND OF THE INVENTION

1. Field of the Invention

The present invention relates to an anti-pinch sensor, in particular for detecting an obstacle in the path of an actuator of a motor vehicle, having a first measurement electrode and having a second electrically isolated measurement electrode spaced a distance from the first measurement electrode, wherein the first measurement electrode is designed to generate an external electric field with respect to the second measurement electrode. The invention further concerns a sensor device having such an anti-pinch sensor, wherein a measurement electronics unit is provided for evaluating the measured capacitance between the measurement electrodes.

2. Description of the Background Art

An anti-pinch sensor of the aforementioned type uses the capacitive measurement principle to detect an obstacle. To this end, an external electric field is produced by means of the two measurement electrodes. If a dielectric enters this electric field, the capacitance of the capacitor formed by the measurement electrodes changes. In this way, it is theoretically possible to detect an obstacle in the path of an actuator of a motor vehicle as long as its relative dielectric constant $\in_r$ is different from the relative dielectric constant of air. A change in the capacitance is also produced in the event that the intruding obstacle is connected to ground, since the charge distribution on the measurement electrodes is changed thereby.

The obstacle in the path of an actuator is detected without physical contact with the anti-pinch sensor. In other words, what is known as a contactless sensor is involved here. If a capacitance change is detected, countermeasures, as for example stopping or reversing the drive, can be initiated in time, before actual pinching of the obstacle occurs. In the case of actuators in a motor vehicle, this can involve an electrically operated window, an electrically operated sliding door, or an electrically operated tailgate, for example. An anti-pinch sensor based on the capacitive measurement principle can also be employed for detecting obstacles in the case of an electrically operated seat.

An anti-pinch sensor of the aforementioned type is known from U.S. Pat. No. 6,972,575 B2, for example. There, a ground electrode is located between the two measurement electrodes, and effects a shielding on the direct connecting line between the measurement electrodes. In this way, the sensitivity of the anti-pinch sensor to obstacles in the external electric field is increased.

Also, an anti-pinch sensor of the aforementioned type is known from EP 1 455 044 A2, where, in addition to a capacitance sensing between the two measurement electrodes, electrical contact with them is detected in the event that an external force acts. For this dual function as both a contactless and tactile sensor, the measurement electrodes are embedded in an elastomeric material and are spaced apart from one another by a hollow chamber.

In addition, an anti-pinch sensor of the aforementioned type is described in EP 1 154 110 A2, in which the measurement electrodes creating the external electric field are designed to be movable relative to one another. This is accomplished, for example, by a hollow space or by means of an elastic material. Through detection of a change in the capacitance of the capacitor composed of the measurement electrodes, an obstacle is detected both in a contactless manner during its approach and by direct contact with the sensor, wherein the distance of the measurement electrodes from one another changes.

SUMMARY OF THE INVENTION

It is therefore an object of the present invention to provide an improved anti-pinch sensor of the aforementioned type operating according to the capacitive measurement principle, which is suitable for contactless as well as tactile detection of obstacles.

Accordingly, an anti-pinch sensor is provided that comprises a first measurement electrode and a second, electrically isolated measurement electrode spaced a distance from the first measurement electrode, wherein the first measurement electrode is designed to generate an external electric field with respect to the second measurement electrode, and wherein the first and the second measurement electrodes are elastically supported relative to an electrically isolated ground electrode.

The invention is based on the idea of detecting a differential capacitance between the two measurement electrodes rather than detecting a capacitance between each of the measurement electrodes and the ground electrode. The differential capacitance is influenced both by the approach of an external obstacle in the external electric field produced by the two measurement electrodes and by a change in position of the ground electrode. For, as in the case where an obstacle with a connection to ground enters the external electric field, the charge distribution on the measurement electrodes is also affected by a position change of the ground electrode that is at a ground potential such as ground, relative to the measurement electrodes.

In this way, the single measure of providing an elastic support of the measurement electrodes relative to the ground electrode makes the specified anti-pinch sensor suitable for use as both a contactless and a tactile sensor. Both measurement principles are implemented here by detection of the differential capacitance between the measurement electrodes.

In a conventional capacitive sensor, surface contamination results in measurement artifacts that can be erroneously interpreted as a pinch event. The specified anti-pinch sensor additionally offers the great advantage of the ability to compensate for such measurement artifacts in a simple manner.

Contaminants or a water film on the surface of the anti-pinch sensor generally facing the area at risk acts on the differential capacitance between the measurement electrodes like the introduction of a dielectric into a capacitor. Since contaminants and water have a relative dielectric constant greater than air, the capacitance between the measurement electrodes will increase in the event of surface contamination or a water film.

However, extensive investigations have shown that an obstacle with a connection to ground, as for example a human hand that has a ground connection through the skin, that enters the external field initially leads to a reduction in the capacitance as a result of the altered charge distribution. Only with further approach does the dielectric constant of the obstacle, which may be greater than that of air, have an effect, and in the near field can once again result in an increase in the measured capacitance.

The specified anti-pinch sensor is thus capable of distinguishing between an obstacle entering the area at risk and a surface contamination by dirt or water. An increase in the measured capacitance can thus be attributed to a surface film, and a reduction in the capacitance, especially in the case of a motion of the actuator, can be interpreted as a pinch event.

Finally, as the obstacle further approaches the anti-pinch sensor, direct contact of the anti-pinch sensor with the obstacle takes place. Because of the elastic support of the measurement electrodes relative to the ground electrode, the force acting here as a result of the direct physical contact causes the ground electrode to approach the measurement electrodes. This approach of the ground electrode, which is at ground potential, reduces the coupling between the measurement electrodes, so that the measured capacitance decreases in this case as well.

To detect the differential measured capacitance, the first electrode is, for example, subjected to an AC voltage relative to the ground potential, such as the ground, by means of a suitable voltage generator. The second measurement electrode is connected to the ground potential through an impedance. In this way, the measured capacitance between the two measurement electrodes can be accessed, for example, as phase or amplitude information of a voltage signal via a measurement bridge connected between the second measurement electrode and the ground potential (by means of the impedance).

The invention is not limited to a specific arrangement of the measurement electrodes relative to the ground electrode. Thus, the measurement electrodes can be positioned in the anti-pinch sensor in any desired way relative to the ground electrode, since any position change of the measurement electrodes relative to the ground electrode will lead to an altered charge distribution and thus a changed measured capacitance.

However, practical considerations suggest arranging the first and second measurement electrodes on a first plane that is spaced apart from a second plane in which the ground electrode is arranged. In this way, it is possible in particular to implement an anti-pinch sensor of flat construction, which can be routed along the closure edge of a movable actuator, for example. Alternatively, it is also possible to adapt the positioning of the measurement electrodes relative to the ground electrode to the mechanical situation, especially that of a motor vehicle.

Moreover, for the anti-pinch sensor it is not strictly necessary for the ground electrode to be implemented as a component of the sensor. In particular, the anti-pinch sensor can be equipped with only the two measurement electrodes and can be placed on the grounded body of a motor vehicle. In this case the vehicle body as such constitutes the ground electrode. In this embodiment it is only necessary to place an intermediate layer between the measurement electrodes and the vehicle body acting as the ground electrode, elastically spacing the measurement electrodes from the vehicle body.

However, it is advantageous for the ground electrode itself to be a sensor component and to be embedded in the sensor body for this purpose. In this context, the elastic support can also be implemented by the aforementioned intermediate layer of elastic material by which the measurement electrodes are spaced apart from the ground electrode. Alternatively, however, it is also possible to embed the ground electrode and the measurement electrodes in an elastic material, wherein the measurement electrodes are separated from the ground electrode by a hollow chamber. In both mutually complementary embodiments, the effect of an external force on the sensor body will result in the measurement electrodes approaching the ground electrode.

In another preferred embodiment, the measurement electrodes are each located in an edge region of the anti-pinch sensor. By this means, the measured capacitance is decreased as a result of the larger separation of the measurement electrodes from one another. By this means, the changes in the measured capacitance caused by an obstacle are increased in relation. This measure thus improves the sensitivity of the anti-pinch sensor. Moreover, the range of the external electric field can be increased by arranging the measurement electrodes in an edge region of the anti-pinch sensor.

The above-described anti-pinch sensor is also not limited as to the shape of the electrodes themselves. However, it is useful for the electrodes to be made flat, which in turn permits a flat design of the anti-pinch sensor. Also, good orientation of the external electric field is possible through such a flat design of the electrodes, which in turn makes it possible to achieve a long range.

With a flat design of the electrodes, it is also advantageous if the area of the ground electrode sweeps the areas of the other measurement electrodes in projection. By this means, the largest possible change in the measured capacitance is ensured when the ground electrode approaches the measurement electrodes, with a simple basic design of the anti-pinch sensor.

In another preferred embodiment of the anti-pinch sensor, a third measurement electrode, electrically isolated from the first and second measurement electrodes, is provided that is adjacent to the second measurement electrode, wherein the measurement electrodes are designed to produce a first external electric field between the first and second measurement electrodes and a second external electric field between the first and third measurement electrodes, and wherein the second external electric field has a smaller range than the first external electric field.

In such an anti-pinch sensor, differences in the detected changes in the capacitances associated with the two external fields can be used to detect surface deposits of contaminants or water on the sensor body.

If contaminants or water are present as a deposit or film on the surface of the anti-pinch sensor, this causes a change in the capacitance of the capacitor composed of the first and second measurement electrodes, and also of the capacitor composed of the first and third measurement electrodes. This is a near-field effect on the two capacitances. In contrast, an obstacle approaching from the far field chiefly causes a change in the capacitance of the capacitor that produces an external electric field extending further into the areas at risk. In the present case, this is the capacitance of the capacitor composed of the first and second measurement electrodes. While the near field has not yet been reached by the obstacle entering the area at risk, and thus no capacitance change is yet detectable, the obstacle has already been detected by the electric field having a larger range, or is detectable as a capacitance change.

Accordingly, an anti-pinch sensor designed in this way makes it possible to detect a contaminant deposit or water film on the surface of the sensor as a common-mode signal and to detect an approaching obstacle as a differential signal, and thus to distinguish between them.

The different ranges of the electric fields produced by means of the measurement electrodes can be influenced or achieved here by the geometry and/or dimensioning of each measurement arrangement. Thus, for example, the third measurement electrode can be designed to achieve an electric field with the shortest possible range in that the field lines of the electric field have a path between the third and first measurement electrodes that is as direct as possible. In contrast, the second measurement electrode can be designed, located, or dimensioned such that the field lines of the electric field generated relative to the first measurement electrode take as long a detour as possible through the actuator's area at risk, after the fashion of a stray-field capacitor. In particular, the third measurement electrode can be located immediately adjacent to the first measurement electrode, while in contrast the second measurement electrode is spaced apart from the opposite electrode.

Another useful embodiment is provided by the means that the second measurement electrode is located in the edge region of the anti-pinch sensor, and the third measurement electrode is located between the first and second measurement electrodes. With a flat design and simple construction, this ensures that the second external electric field has a smaller range than the first external electric field. When the measurement electrodes are planar in design, the capacitance of the capacitors formed in each case can be determined or adjusted in a known manner through the size of the area. It is thus possible to set the ratio of the capacitances composed of the first and second or the first and third measurement electrodes through the ratios of the measurement electrode areas to one another. In particular, the range of the first external electric field extending into the area at risk can be increased by enlarging the area of the second measurement electrode.

In particular, it is possible to achieve, through suitable dimensioning of the measurement electrode areas, that a dielectric introduced into the immediate vicinity in both external electric fields will not cause any drift of the measured capacitances. In other words, the dimensioning is chosen such that deposits of contaminants or water on the surface of the sensor result in an approximately equal change in the capacitances of the capacitors that include the second or third measurement electrode. Consequently, a differential signal produced from the capacitances of the two capacitors experiences either essentially no change or only a negligible change as a result of a contaminant deposit or a water film on the surface of the sensor.

In a useful embodiment, the electrodes and the intermediate layer are arranged in a sensor body made of a flexible substrate material. This makes it possible to easily route the anti-pinch sensor along the contour of a closure edge of a motor vehicle. In particular, the sensor body can take the form of a flexible ribbon cable. It is likewise possible to design the sensor body as a seal or to integrate the sensor body into a seal. The seal is provided to seal the actuator against the closure edge in the closed state. One example of this is a sealing lip, which seals a movable side window of a motor vehicle against its closure edge.

A flexible ribbon cable is also called an FFC ("Flexible Flat Cable"), and is characterized in that parallel conductor structures are laid in a flexible cable body. As an alternative to an FFC, a flexible conductor structure can also be used as a sensor body. A flexible conductor structure is also known by the name FPC ("Flexible Printed Circuit"). Here, conductive traces are specifically arranged or laid in a flexible insulating material, in particular in a multilayer arrangement. Such an embodiment permits high flexibility with respect to the dimensioning and arrangement of the individual conductive traces so that the measurement electrodes of the anti-pinch sensor can be arranged or dimensioned in the desired way.

In another advantageous embodiment, the sensor body extends essentially along a longitudinal direction, wherein in a useful embodiment the first measurement electrode is subdivided in the longitudinal direction into separately controllable individual electrodes. This achieves the result that the measurable capacitance between each of the measurement electrodes is reduced, since the full area of the measurement electrodes is divided into multiple segmented individual areas of the separate individual electrodes. However, a low capacitance formed overall between the measurement electrodes has the result that a small capacitance change relative to the total measured capacitance is easier to detect. An anti-pinch sensor of such design also allows the detection of a capacitance change by means of a multiplexing method. In this regard, the individual electrodes can be controlled through individual supply lines, either offset in time (serially) or simultaneously (parallel). This also permits spatial resolution of a pinch event. A segmentation of only the first measurement electrode serving as transmitting electrode has the advantage here that a spatial and/or temporal control is possible, with it only being necessary here to provide or perform one evaluation, namely of the non-segmented additional electrodes. In another preferred variant, however, all measurement electrodes are subdivided into individual electrodes.

In the embodiment just described, it is possible, in particular, to shield the supply lines to the individual electrodes by means of the ground electrode. In this way, direct capacitances of the supply lines are prevented.

For the purpose of shielding, it is also advantageous to provide a second ground electrode as a sensor component, wherein the supply lines are arranged for shielding between the two ground electrodes. By means of such an arrangement, direct capacitances of the supply lines relative to external surfaces at another potential and also with respect to the individual electrodes are prevented.

It is a further object of the invention to specify an improved sensor device compared to the prior art, with which it is possible to detect a pinch event both in the case of direct contact and in a contactless manner.

This object is attained according to the invention by a sensor device with an anti-pinch sensor of the above-described type, wherein a measurement electronics unit is provided for detecting a measured capacitance between the first measurement electrode and the second measurement electrode.

Advantageous embodiments are evident from the dependent claims relating to the sensor device. The advantages cited for the anti-pinch sensor are also applicable in like manner for the sensor device.

In a preferred embodiment, the measurement electronics unit is designed to identify as a pinch event a measured capacitance that is decreasing with respect to a ground capacitance. As already explained, an obstacle with a connection to ground that is entering the sensed area at risk leads to a decrease in the measured capacitance. The measured capacitance likewise decreases in the event that the ground electrode approaches the measurement electrodes as the result of the sensor coming into direct contact with an obstacle. In this respect, a decreasing measured capacitance is an indication of the presence of a pinch event.

Furthermore, it is advantageous for the measurement electronics unit to be designed to identify a measured capacitance that is increasing with respect to a ground capacitance as surface contaminants or water acting on the sensor. As explained, such action has an effect like the introduction of a dielectric with a larger relative dielectric constant into the capacitor between the first and second measurement electrodes.

Now, an obstacle that has already entered the area at risk could likewise result in an increase in the measured capacitance in the near-field region on account of the higher relative dielectric constant. However, such an increase in the measured capacitance brought about by an obstacle in the near field has already been preceded by a reduction in the measured capacitance during entry of the obstacle from the distance. Accordingly, if the time behavior of the change in measured capacitance is registered, it is possible to reliably distinguish a pinch event from a measurement artifact resulting from the action of contaminants or water on the surface.

In the design of the anti-pinch sensor with three measurement electrodes, wherein an external electric field of smaller range is produced between the first and third measurement electrodes than between the first and second measurement electrodes, the measurement electronics unit is advantageously designed to detect a drift in the capacitance between the first and second measurement electrodes as compared to a capacitance between the first and third measurement electrodes.

As already described, a surface deposit of contaminants or water leads to an equal change in the two measured capacitances, whereas by contrast an obstacle entering from the far field initially affects only the measured capacitance between the first and second measurement electrodes. By observation of the drift of the measured capacitances relative to one another, a pinch event can in this respect be distinguished clearly from a measurement artifact resulting from the action of contaminants or water on the surface.

In a useful embodiment of the sensor device, wherein the measurement electrodes of the anti-pinch sensor are subdivided into separately controllable individual electrodes, the measurement electronics unit is preferably designed to control the individual electrodes separately, and to evaluate their measured capacitances individually. This permits spatial resolution of the pinch events detected.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
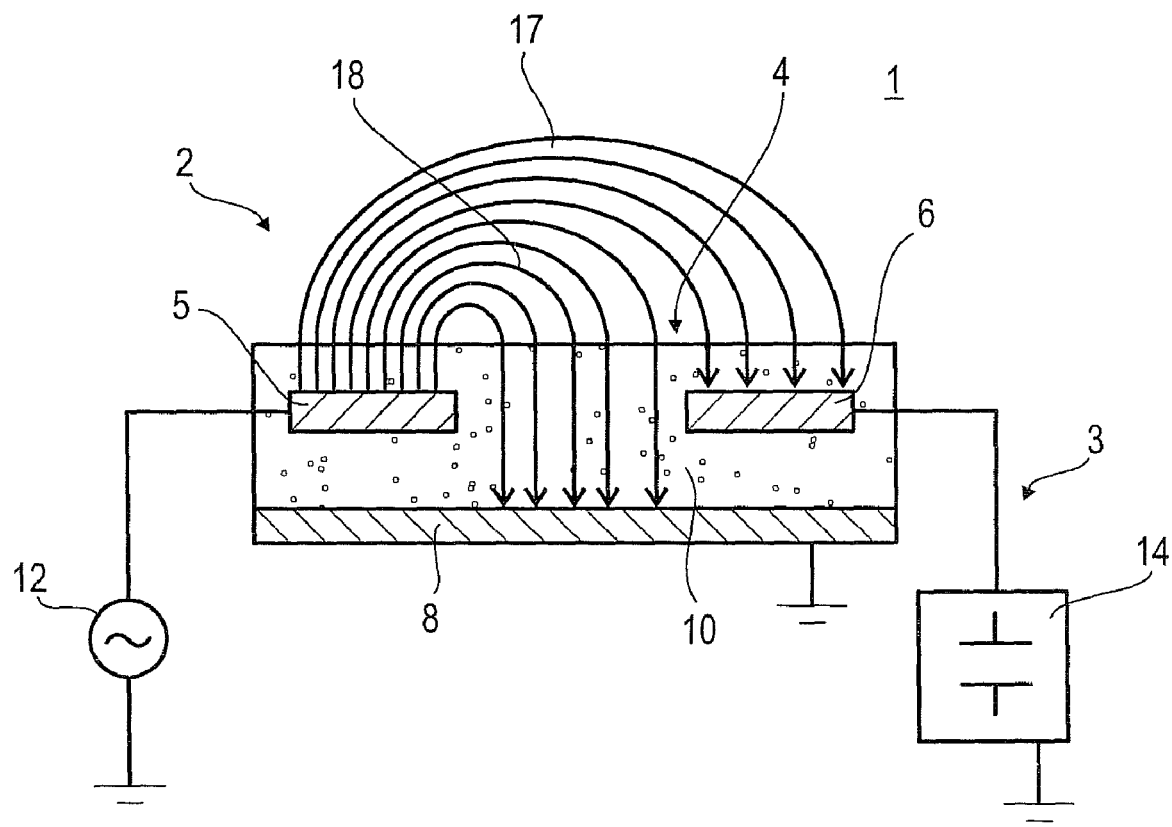
FIG. 1 schematically shows a sensor device with an anti-pinch sensor and a measurement device.

Shown schematically in FIG. 1 is a sensor device 1, which comprises a capacitive anti-pinch sensor 2 and a measurement device 3 for sensing a measured capacitance. The capacitive anti-pinch sensor 2 is shown in cross section.

Visible is the sensor body 4, in the interior of which are arranged a first planar measurement electrode 5 and a second planar measurement electrode 6. The two measurement electrodes 5, 6 are arranged opposite a planar ground electrode 8 and in an elastic and electrically insulating sensor material 10. An elastomeric plastic or a rubber may be used as such a sensor material 10, for example. In particular, a microcellular rubber, which is to say an elastic foam with relatively small pore size, or an EPDM, which is to say an ethylene propylene diene rubber, may be used. The ground electrode 8 is not a part of the sensor body 4 here. Instead, it is part of the grounded body of a motor vehicle, in particular a closure edge of an actuator, such as an adjustable side window.

The measurement electronics unit 3 comprises an alternating current source 12 and an analysis circuit 14 for detecting the measured capacitance formed between the two measurement electrodes 5 and 6. In order to detect the measured capacitance, AC voltage is applied by the alternating current source 12 to the first measurement electrode 5 relative to the ground potential, such as ground. In order to detect the measured capacitance, the analysis circuit 14 comprises, for example, a suitable measurement bridge between the second measurement electrode 6 and the ground potential. The measured capacitance can be detected here either from the phase angle or equally well from the amplitude of a voltage value obtained through the measurement bridge. A change in the measured capacitance can also be determined from a differential signal of the detected phases or amplitudes as compared to the corresponding values of a reference measurement bridge with a predetermined capacitance.

It is also evident in FIG. 1 that, as a result of the application of an AC voltage signal to the first measurement electrode 5 relative to the ground potential, an external electric field 17 is produced with respect to the second measurement electrode 6. In like manner, a direct electric field 18 is created between the first measurement electrode 5 and the ground electrode 8, which is at ground potential or ground. The geometry and arrangement of the measurement electrodes 5, 6 are chosen here such that the external electric field 17 which is generated extends into an area at risk where an obstacle should be detected in a contactless manner.

If an obstacle approaching from a distance enters the external electric field 17 of the anti-pinch sensor 2, the measured capacitance sensed through the analysis circuit will change. In particular, such a change in the measured capacitance is based on the fact that the charge distribution on the measurement electrodes 5, 6 changes in the event that the obstacle is connected to ground.

Figure 2:
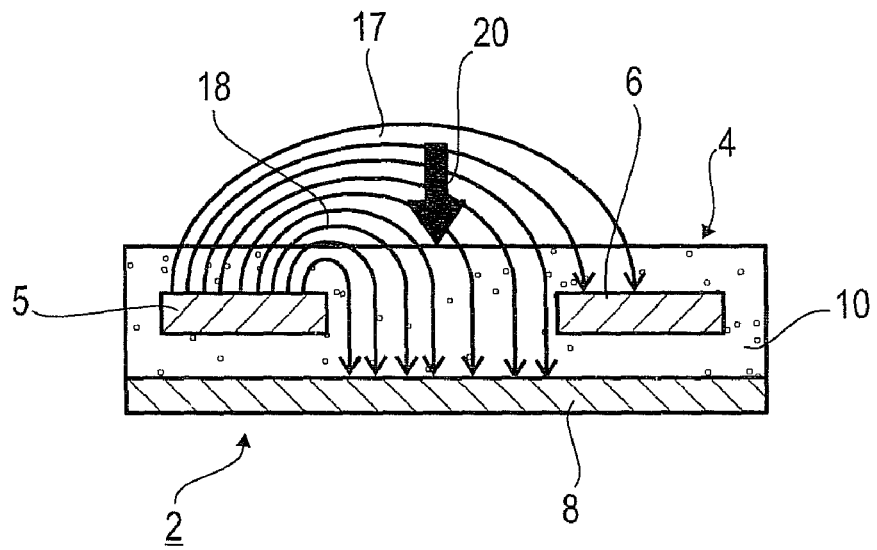
FIG. 2 shows a cross-section of the anti-pinch sensor from FIG. 1 with two measurement electrodes spaced a distance from a ground electrode.

FIG. 2 shows the anti-pinch sensor 2 from FIG. 1 under the influence of an external force. For example, an external force 20 acts on the anti-pinch sensor 2 when an obstacle is located between the actuator and the closure edge, and the driven actuator presses the obstacle against the sensor body 4 of the anti-pinch sensor 2.

Such a force 20 results in a compression of the elastic sensor material 10 in the direction of the force 20. As shown, this reduces the spacing between the measurement electrodes 5 and 6 with respect to the ground electrode 8. As a result of the approach of the ground electrode 8, which is at ground potential or ground, the charge distribution on the two measurement electrodes 5 and 6 changes. This change in the charge distribution can also be described by saying that the direct electric field 18 between the first measurement electrode 5 and the ground electrode 8 intensifies as a result of the closer ground electrode 8. In other words, field lines are withdrawn from the external electric field 17. The coupling of the two measurement electrodes 5 and 6 decreases; for equal voltage the capacitor composed of the first and second measurement electrodes will store less charge. As a result, the measured capacitance decreases relative to the unstressed state of the anti-pinch sensor 2.

The anti-pinch sensor 2 shown is thus also able to detect the action of an external force 20 through a change in the measured capacitance. A measurement electronics unit 3 for sensing the measured capacitance is sufficient for both contactless and tactile detection of an obstacle or pinch event.

Figure 3:
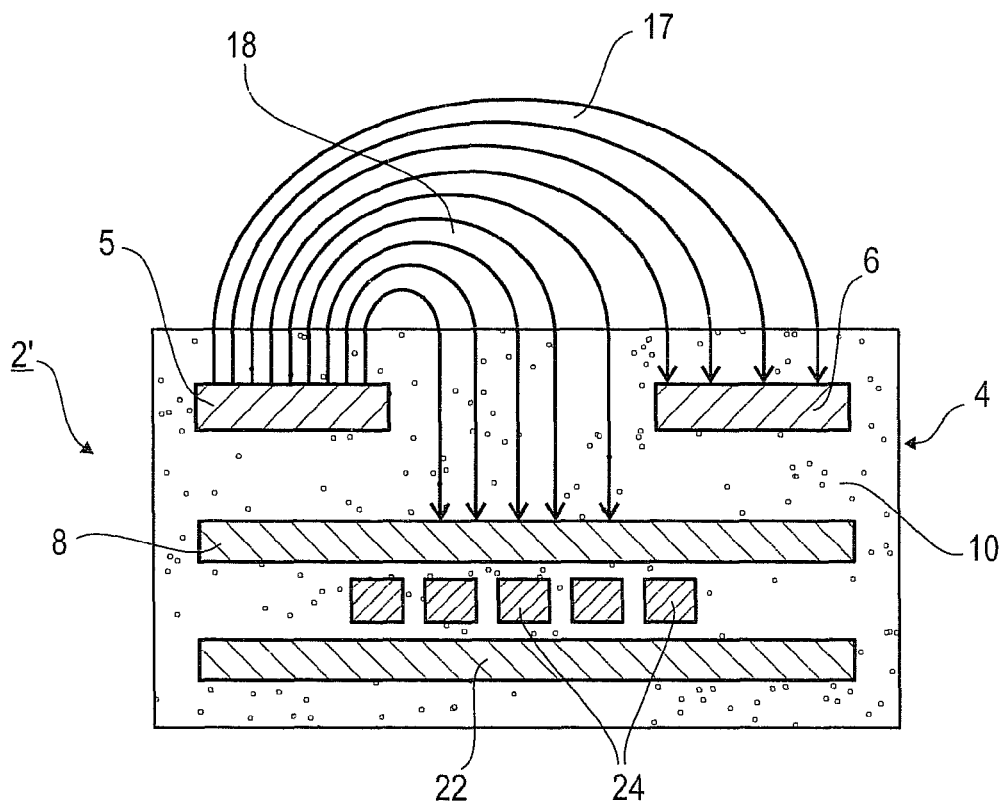
FIG. 3 shows a cross-section of another anti-pinch sensor, wherein the measurement electrodes are subdivided into individual electrodes and are contacted by means of shielded supply lines.

In FIG. 3, a modified anti-pinch sensor 2' is shown, again in cross section. The sensor body 4 is visible, which comprises measurement electrodes 5 and 6 embedded in an elastic sensor material 10. The ground electrode 8 is arranged in a plane opposite the measurement electrodes 5 and 6, likewise embedded in the sensor body 4, whose area sweeps the areas of the measurement electrodes 5 and 6 in projection. In addition, a second planar ground electrode 22 is arranged in the sensor body 4.

In the anti-pinch sensor 2' shown, the measurement electrodes 5 and 6 are separated into a number of individual electrodes along the sensor body 4, which is to say into the plane of the drawing. Each of these individual electrodes has a supply line 24. The individual supply lines 24 are arranged to be shielded between the first and second ground electrodes 8 and 22.

The principle of operation of the anti-pinch sensor 2' shown with regard to the detection of a pinch event corresponds to that of the anti-pinch sensor 2 from FIG. 2. However, the separate control of the individual electrodes via the different supply lines 24 permits spatial resolution of the detected pinch events. The measurement electronics unit 3 can be designed here such that the measured capacitances of the individual electrodes can be evaluated either serially or in parallel with one another.

Figure 6:
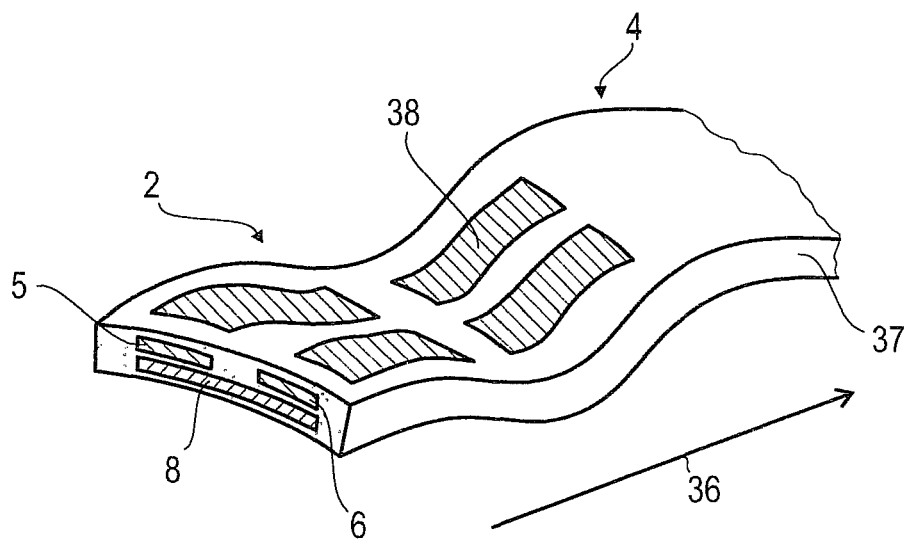
FIG. 6 shows an anti-pinch sensor similar to the one in FIG. 2 made of a flexible substrate material which extends essentially in a longitudinal direction.

The fundamental structure of the anti-pinch sensor 2' from FIG. 3 is evident from FIG. 6, in particular. Like the anti-pinch sensor 2 shown schematically there, the anti-pinch sensor 2' from FIG. 3 also extends essentially along a longitudinal direction 36, wherein the sensor material 10 as a whole forms a flexible substrate in which the individual electrodes 5, 6, 8, 22, 24 are embedded.

As an alternative to a uniform structure with a single elastic and flexible sensor material 10, it is also possible to provide an intermediate layer of a material of higher elasticity only between the measurement electrodes 5 and 6 and the ground electrode 8, and to provide a material of lower elasticity as the remaining flexible substrate material.

Figure 4:
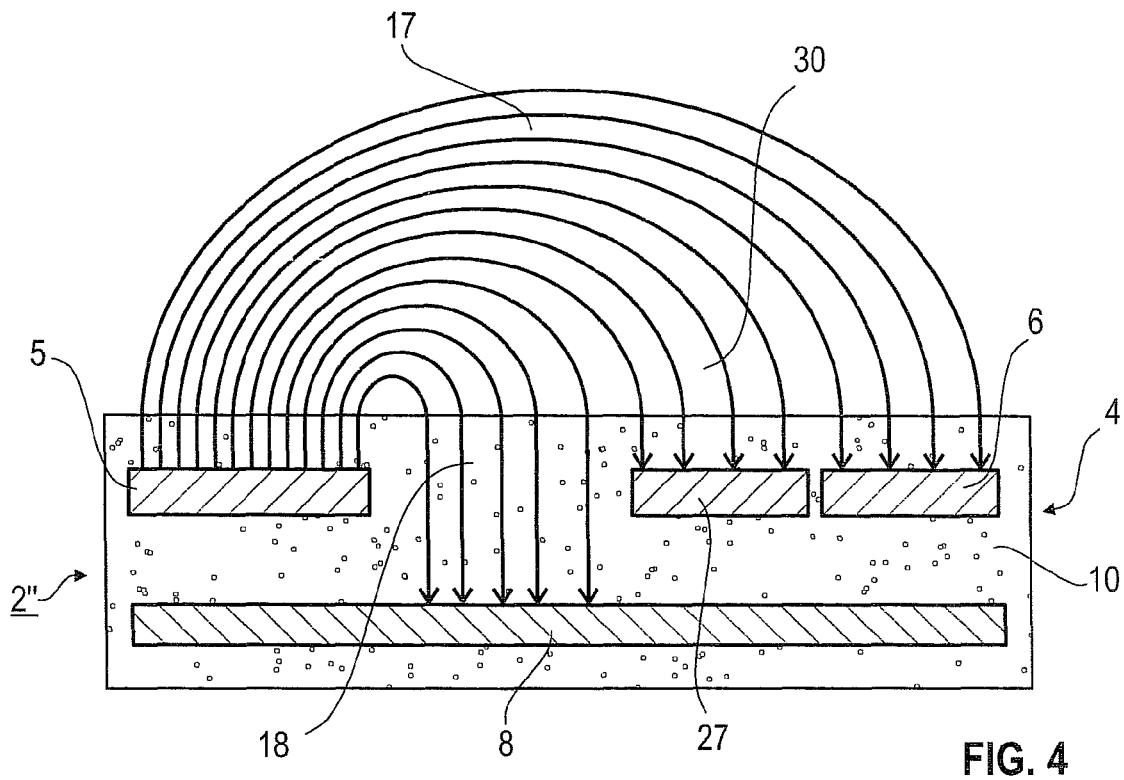
FIG. 4 shows a cross-section of another anti-pinch sensor, with three measurement electrodes and a ground electrode.

FIG. 4 shows another anti-pinch sensor 2" in cross-section. It can be seen that, in addition to the ground electrode 8, the first measurement electrode 5 and the second measurement electrode 6, the anti-pinch sensor 2" now has a third measurement electrode 27 located in a plane between the first and second measurement electrodes 5 and 6. The second measurement electrode 6 is located in an edge region of the sensor body 10. The first, second, and third measurement electrodes 5, 6, and 27 are elastically supported opposite the ground electrode 8 by the elastic sensor material 10.

For operation of the anti-pinch sensor 2" shown in FIG. 4, the first measurement electrode 5—as is shown in FIG. 1—has an AC voltage applied to it relative to the ground potential, while the second and third measurement electrodes 6 and 27, like the ground electrode 8, are connected to the ground potential through a defined impedance. An external electric field 17 arises between the first measurement electrode 5 and the second measurement electrode 6. An inner electric field 18 also arises between the first measurement electrode 5 and the ground electrode 8. Moreover, a second external electric field 30 arises as a result of the potential difference between the first measurement electrode 5 and the third measurement electrode 27.

It is evident that, due to the greater separation of the second measurement electrode 6 from the first measurement electrode 5, the first external electric field 17 extends further into space than the second external electric field 17 between the first measurement electrode 5 and the closer third measurement electrode 27.

For detecting a pinch event, a measured capacitance between the first measurement electrode 5 and one of the two other measurement electrodes 6 and 27 can be analyzed. In this case, the anti-pinch sensor 2" shown in FIG. 3 behaves analogously to the anti-pinch sensor 2 shown in FIG. 1 or 2.

However, it is equally possible with the anti-pinch sensor 2" to determine the difference between the two measured capacitances produced between the first measurement electrode 5 and the second measurement electrode 6, or between the first measurement electrode 5 and the third measurement electrode 27. Such a detection advantageously makes it possible to distinguish surface deposits on the sensor body 4 and the resultant changes in the measured capacitances from an actual pinch event. While a surface deposit on the sensor body 4 results in an approximately equal change in the two observed measured capacitances, this is not the case either when the obstacle approaches from the far field or in the case of force acting directly on the sensor body 4.

An approach of an obstacle from the far field primarily has an effect on the first external electric field 17. An approach of the measurement electrodes 5, 6 and 27 with respect to the ground electrode 8 resulting from the application of force to the sensor body 4 primarily has an effect on the second external electric field 30. Accordingly, if the drift of the two measured capacitances relative to one another is observed, then both a pinch event measured contactlessly and one measured directly by application of force can be reliably distinguished from the case of a surface deposit.

Ideally, the dimensions and arrangement of the measurement electrodes 5, 6 and 27 are chosen such that, when in a normal state, the two measured capacitances between the first measurement electrode 5 and the second measurement electrode 6, and between the first measurement electrode 5 and the third measurement electrode 27, are approximately equal. A surface deposit on the sensor body 4 then does not result in any drift between the measured capacitances. In contrast, an obstacle detected contactlessly and one detected actively through contact produce a measurable drift in the measured capacitances, and these are detectable as a pinch event.

Figure 5:
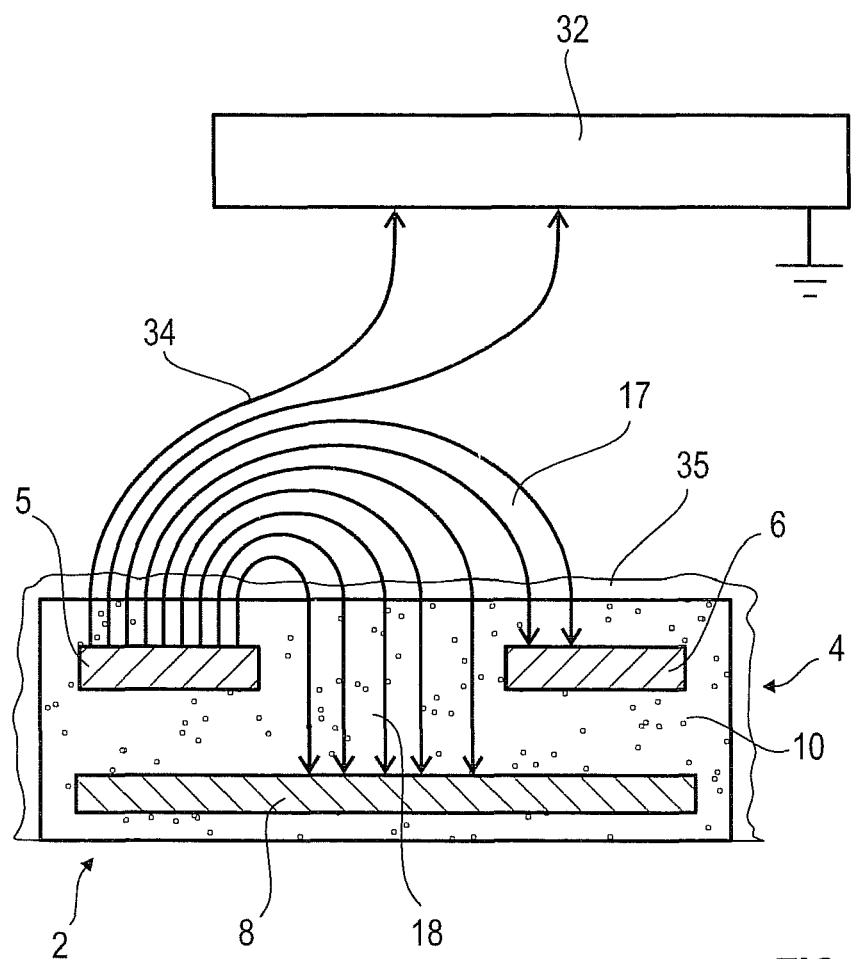
FIG. 5 shows a cross-section of the anti-pinch sensor from FIG. 2 with a surface water film as an obstacle approaches.

In FIG. 5, the anti-pinch sensor 2 from FIG. 1 is shown once more, again in cross section, now with a water film or deposit 35 present on the surface of the sensor body 4. The water film 35 has the same effect as the introduction of a dielectric into the field between the first measurement electrode 5 and the second measurement electrode 6. Since water has a greater dielectric constant than air, this will cause the measured capacitance to increase.

If the external electric field 17 is approached from a distance by an obstacle, such as a human hand 32, for example, which has a ground connection through the skin surface, this weakens the coupling between the first measurement electrode 5 and the second measurement electrode 6. The charge that can be stored on the capacitor produced by the measurement electrodes 5 and 6 becomes smaller, or field lines are withdrawn from the external electric field 17. This latter is illustrated by the field lines 34 in the drawing, which now extend from the first measurement electrode 5 to the hand 32. As a result, the measured capacitance between the first measurement electrode 5 and the second measurement electrode 6 is diminished.

It is now clear that it is possible to make a distinction between an obstacle approaching from a distance and a surface deposit by measuring the differential measured capacitance between the first measurement electrode 5 and the second measurement electrode 6. In the first case, the measured capacitance diminishes. In the second case, the measured capacitance increases as a result of the introduced dielectric. If the human hand 32 finally enters the near field of the anti-pinch sensor 2, the dielectric effect may possibly predominate over the ground connection effect. However, it is also possible in this case to make a clear distinction between an obstacle and a surface deposit. This is due to the fact that, in the case of an obstacle approaching from a distance, an increasing measured capacitance is always preceded by a phase of decreasing measured capacitance. In the case of a surface film of water or contaminants on the sensor body 4, the measured capacitance will increase with no preceding decrease. Moreover, a change in the measured capacitance due to an obstacle tends to have a short time constant, while a change in the measured capacitance due to a surface film or deposit exhibits a greater time constant.

FIG. 6 schematically shows a three-dimensional representation of the structure of an anti-pinch sensor 2 similar to that in FIG. 1. It is now evident that the sensor body 4 extends essentially along a longitudinal direction 36. The anti-pinch sensor 2 or sensor body 4 is made of a flexible substrate material 37 here. Embedded in said substrate material 37 are the measurement electrodes 5 and 6, in the form of individual electrodes 38. The position of the measurement electrodes 5 and 6 with respect to the ground electrode can be seen at the cross-section visible in the front portion. The individual supply lines to the individual electrodes 38 are not shown for reasons of clarity.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. An anti-pinch sensor for detecting an obstacle in the path of an actuator of a motor vehicle, the anti-pinch sensor comprising:
    a first measurement electrode;
    a second electrically isolated measurement electrode spaced a distance from the first measurement electrode;
    a flexible sensor body elastically supporting the first and second measurement electrodes relative to an electrically isolated ground electrode; and
    a measurement electronics unit for detecting a measured capacitance between the first and the second measurement electrodes for contactless detection of the obstacle, and for detecting compression of the sensor body with respect to the ground electrode based on a corresponding change in the measured capacitance as the ground electrode is drawn closer to the first and second measurement electrodes for tactile detection of the obstacle,
    wherein the first measurement electrode is configured to generate an external electric field with respect to the second measurement electrode.

2. Anti-pinch sensor according to claim 1, wherein the first and second measurement electrodes are arranged on a first plane that is spaced apart from a second plane on which the ground electrode is arranged.

3. Anti-pinch sensor according to claim 1, further comprising an intermediate layer formed of an elastic and electrically insulating material for elastically supporting the two measurement electrodes with respect to the ground electrode.

4. Anti-pinch sensor according to claim 3, wherein the electrodes and the intermediate layer are arranged in a sensor body made of a flexible substrate material.

5. Anti-pinch sensor according to claim 4, wherein the sensor body extends essentially along a longitudinal direction, and wherein the first measurement electrode is subdivided in the longitudinal direction into separately controllable individual electrodes.

6. Anti-pinch sensor according to claim 5, wherein all measurement electrodes are subdivided in the longitudinal direction into separately controllable individual electrodes.

7. Anti-pinch sensor according to claim 5, wherein supply lines to the individual electrodes are shielded by the ground electrode.

8. Anti-pinch sensor according to claim 7, wherein a second ground electrode is provided as a sensor component, and wherein the supply lines are arranged for shielding between the two ground electrodes.

9. Anti-pinch sensor according to claim 1, wherein the ground electrode is a component of the sensor.

10. Anti-pinch sensor according to claim 1, wherein the measurement electrodes are each located in an edge region.

11. Anti-pinch sensor according to claim 1, wherein the electrodes are each flat in design.

12. Anti-pinch sensor according to claim 11, wherein the area of the ground electrode sweeps the areas of both measurement electrodes in projection.

13. Anti-pinch sensor according to claim 1, wherein a third measurement electrode, electrically isolated from the first and second measurement electrodes, is provided that is adjacent to the second measurement electrode, and in that the measurement electrodes are designed to produce a first external electric field between the first and second measurement electrodes and a second external electric field between the first and third measurement electrodes, wherein the second external electric field has a smaller range than the first external electric field.

14. Anti-pinch sensor according to claim 1, wherein the measurement electronics unit is designed to identify as a pinch event a measured capacitance that is decreasing with respect to a ground capacitance.

15. Anti-pinch sensor according to claim 1, wherein the measurement electronics unit is designed to identify as contamination a measured capacitance that is increasing with respect to a ground capacitance.

16. Anti-pinch sensor according to claim 1, wherein a third measurement electrode, electrically isolated from the first and second measurement electrodes, is provided that is adjacent to the second measurement electrode, in that the measurement electrodes are designed to produce a first external electric field between the first and second measurement electrodes and a second external electric field between the first and third measurement electrodes, wherein the second external electric field has a smaller range than the first external electric field, and in that the measurement electronics unit is designed to detect a drift in the capacitance between the first and second measurement electrodes as compared to a capacitance between the first and third measurement electrodes.

17. Anti-pinch sensor according to claim 1, wherein the electrodes and an intermediate layer, the intermediate layer being formed of an elastic and electrically insulating material for elastically supporting the two measurement electrodes with respect to the ground electrode, are arranged in a sensor body made of a flexible substrate material, in that the sensor body extends essentially along a longitudinal direction, in that the first measurement electrode is subdivided in the longitudinal direction into separately controllable individual electrodes, and in that the measurement electronics unit is designed to control the individual electrodes separately.

18. Anti-pinch sensor according to claim 17, wherein all measurement electrodes are subdivided in the longitudinal direction into individual electrodes.

19. Anti-pinch sensor according to claim 1, wherein the first and second measurement electrodes are not directly interposed by any ground electrodes.

* * * * *